(12) United States Patent
Radek

(10) Patent No.: US 12,522,915 B2
(45) Date of Patent: Jan. 13, 2026

(54) METHOD FOR CLEANING A VACUUM SYSTEM, METHOD FOR VACUUM PROCESSING OF A SUBSTRATE, AND APPARATUS FOR VACUUM PROCESSING A SUBSTRATE

(71) Applicant: Applied Materials, Inc., Santa Clara, CA (US)

(72) Inventor: Manuel Radek, Aschaffenburg (DE)

(73) Assignee: Applied Materials, Inc., Santa Clara, CA (US)

( * ) Notice: Subject to any disclaimer, the term of this patent is extended or adjusted under 35 U.S.C. 154(b) by 609 days.

(21) Appl. No.: 17/282,280

(22) PCT Filed: Jan. 30, 2019

(86) PCT No.: PCT/EP2019/052253
§ 371 (c)(1),
(2) Date: Apr. 1, 2021

(87) PCT Pub. No.: WO2020/156659
PCT Pub. Date: Aug. 6, 2020

(65) Prior Publication Data
US 2021/0391537 A1 Dec. 16, 2021

(51) Int. Cl.
*C23C 14/12* (2006.01)
*B08B 7/00* (2006.01)
(Continued)

(52) U.S. Cl.
CPC .......... *C23C 14/564* (2013.01); *B08B 7/0035* (2013.01); *B08B 9/08* (2013.01);
(Continued)

(58) Field of Classification Search
None
See application file for complete search history.

(56) References Cited

U.S. PATENT DOCUMENTS

| 4,452,642 A * | 6/1984 | Dietz | B08B 7/0035 134/1 |
| 6,432,255 B1 | 8/2002 | Sun et al. | |

(Continued)

FOREIGN PATENT DOCUMENTS

| CN | 1507502 A | 6/2004 |
| CN | 101126147 A | 2/2008 |

(Continued)

OTHER PUBLICATIONS

Rodriguez (2016). Investigation and Optimization of Plasma Cathode Electron Beam Gun for Material Processing [Doctoral dissertation, Brunel University]. http://bura.brunel.ac.uk/handle/2438/13565.*

(Continued)

*Primary Examiner* — Charles Capozzi
(74) *Attorney, Agent, or Firm* — Patterson + Sheridan, LLP

(57) ABSTRACT

A method for cleaning a vacuum chamber, particularly a vacuum chamber used in the manufacture of OLED devices is described. The method includes cleaning at least one of an inside of the vacuum chamber and a component inside the vacuum chamber with active species, a process gas for generating the active species includes at least 90% oxygen and 5 at least 2% argon, particularly, wherein the process gas includes about 95% oxygen and about 5% argon.

14 Claims, 4 Drawing Sheets

(51) Int. Cl.
  *B08B 9/08* (2006.01)
  *C23C 14/56* (2006.01)
  *C23C 16/44* (2006.01)
  *H01J 37/32* (2006.01)
  *H10K 71/16* (2023.01)
  *H10K 71/00* (2023.01)

(52) U.S. Cl.
  CPC .......... *C23C 14/12* (2013.01); *C23C 16/4405* (2013.01); *H01J 37/32357* (2013.01); *H01J 37/32862* (2013.01); *H10K 71/164* (2023.02); *B08B 2209/08* (2013.01); *C11D 2111/20* (2024.01); *C11D 2111/46* (2024.01); *H10K 71/00* (2023.02)

(56) References Cited

U.S. PATENT DOCUMENTS

| | | | | |
|---|---|---|---|---|
| 2002/0179247 | A1* | 12/2002 | Davis | C23C 16/45578 156/345.48 |
| 2004/0103914 | A1* | 6/2004 | Cheng | H01J 37/32862 134/1.1 |
| 2007/0087579 | A1* | 4/2007 | Kitayama | C23C 16/4405 438/794 |
| 2007/0128876 | A1* | 6/2007 | Fukiage | C23C 16/4405 257/E21.226 |
| 2007/0248767 | A1* | 10/2007 | Okura | C23C 16/4405 427/535 |
| 2007/0254112 | A1 | 11/2007 | Takehara et al. | |
| 2008/0142039 | A1* | 6/2008 | Chen | C11D 2111/46 134/107 |
| 2009/0056743 | A1* | 3/2009 | Choi | B08B 7/0035 134/1.1 |
| 2009/0090382 | A1* | 4/2009 | Morisada | B08B 7/0035 134/1.1 |
| 2009/0117743 | A1* | 5/2009 | Nodera | C23C 16/4405 257/E21.294 |
| 2014/0238438 | A1 | 8/2014 | Segev et al. | |
| 2016/0163519 | A1* | 6/2016 | Vane | H01J 37/32862 315/111.21 |

FOREIGN PATENT DOCUMENTS

| | | |
|---|---|---|
| CN | 101765900 A | 6/2010 |
| CN | 107761050 A | 3/2018 |
| CN | 108346561 A | 7/2018 |
| CN | 109075030 A | 12/2018 |
| CN | 109154077 A | 1/2019 |
| JP | H10-144666 A | 5/1998 |
| JP | 2007284793 A | 11/2007 |
| JP | 2013-102200 A | 5/2013 |
| JP | 2014-165169 A | 9/2014 |
| KR | 1020010001770 A | 1/2001 |
| TW | 201433371 A | 9/2014 |
| TW | 201529879 A | 8/2015 |
| WO | 2005-098922 A1 | 10/2005 |
| WO | 2018/197008 A1 | 11/2018 |

OTHER PUBLICATIONS

Chinese Office Action dated May 11, 2022 for Application No. 201980067814.8.
Japanese Office Action dated Jul. 12, 2022 Application No. 2021-518175.
International Search Report and Written Opinion, PCT/EP2019/052253, Oct. 29, 2019.
TW Application No. 109102590, Office Action dtd Apr. 12, 2022; no translation available.
Korean Office Action issued to Application No. 029408565 on Mar. 29, 2023.
"Heat Treatment Equipment", Shanghai Mechanical Engineering Society Heat Treatment Professions Group, Shanghai Science and Technology Compilation Center, pp. 41-49, Jul. 31, 1963.
"Vacuum Technology & Equipment", Editor-in-Chief by Zuo-Tong Liu, Nanjing: Southeast University Press, pp. 6-11, May 31, 1991.
"Daxue Wuli Jiaocheng", Editors-in-Chief by Zhi-Tong Han, Mao-Lin Bo, Chao Wang, Chengdu: University of Electronic Science and Technology of China Press, pp. 139-142, Mar. 31, 2018.
China Office Action issued to Patent Application No. 201980067814.8 on May 11, 2023.
Japanese Office Action for Application No. 2023-031469; no translation available issued Jan. 30, 2024.

* cited by examiner

METHOD FOR CLEANING A VACUUM SYSTEM, METHOD FOR VACUUM PROCESSING OF A SUBSTRATE, AND APPARATUS FOR VACUUM PROCESSING A SUBSTRATE

FIELD

Embodiments of the present disclosure relate to a method for cleaning a vacuum system, a method for vacuum processing a substrate, and an apparatus for vacuum processing of a substrate. Embodiments of the present disclosure particularly relate to methods and apparatuses used in the manufacture of organic light-emitting diode (OLED) devices.

BACKGROUND

Techniques for layer deposition on a substrate include, for example, thermal evaporation, physical vapor deposition (PVD), and chemical vapor deposition (CVD). Coated substrates may be used in several applications and in several technical fields. For instance, coated substrates may be used in the field of organic light emitting diode (OLED) devices. OLEDs can be used in the manufacture of television screens, computer monitors, mobile phones, other hand-held devices, and the like for displaying information. An OLED device, such as an OLED display, may include one or more layers of an organic material situated between two electrodes that are deposited on a substrate.

OLED devices can include a stack of several organic materials, which are for example evaporated in a vacuum chamber of a processing apparatus. The vacuum conditions inside the vacuum chamber and contamination inside the vacuum chamber influences the quality of the deposited material layers and the OLED devices manufactured using these material layers.

For example, an OLED device lifetime is affected by organic contamination. The contamination may originate from parts and materials used inside the vacuum and/or from cross-contamination during maintenance. Cleaning, i.e. removal of contamination, before or during production enables stable, high-quality production of OLED devices.

The duration or time for proper cleaning to arrive at a contamination level suitable for production (preventive maintenance (PM) recovery) is a critical resource. Every minute of tool downtime is costly for an owner of a production system. Accordingly, increasing the cleaning efficiency and decreasing the cleaning time reduces production costs.

Therefore, there is a need for a method and an apparatus that can improve vacuum conditions inside a vacuum chamber and cleaning of a vacuum chamber. The present disclosure particularly aims at reducing contamination such that a quality of layers of an organic material deposited on a substrate can be improved.

SUMMARY

In light of the above, a method for cleaning a vacuum system, particularly used in the manufacture of OLED devices, a method for vacuum deposition on a substrate to manufacture OLED devices, and an apparatus for vacuum deposition on a substrate, particularly to manufacture OLED devices are provided. Further aspects, benefits, and features of the present disclosure are apparent from the claims, the description, and the accompanying drawings.

According to one embodiments, a method for cleaning a vacuum chamber, particularly a vacuum chamber used in the manufacture of OLED devices is provided. The method includes cleaning at least one of a surface of the vacuum chamber and a component inside the vacuum chamber with active species, a process gas for generating the active species includes at least 90% oxygen and at least 2% argon, particularly, wherein the process gas includes about 95% oxygen and about 5% argon.

According to an embodiment, a method for vacuum processing a substrate to manufacture OLED devices is provided. The method includes a method for cleaning according to any of the embodiments described herein, and depositing one or more layers of an organic material on the substrate.

According to an embodiment, an apparatus for vacuum processing a substrate, particularly to manufacture OLED devices is provided. The apparatus includes a vacuum chamber; a remote plasma source connected to the vacuum chamber, the remote plasma source has a process gas inlet and a conduit for active species; and a controller comprising: a processor and a memory storing instructions that, when executed by the processor, cause the apparatus to perform a method according to any of the embodiments of the present disclosure.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Figure 1A:
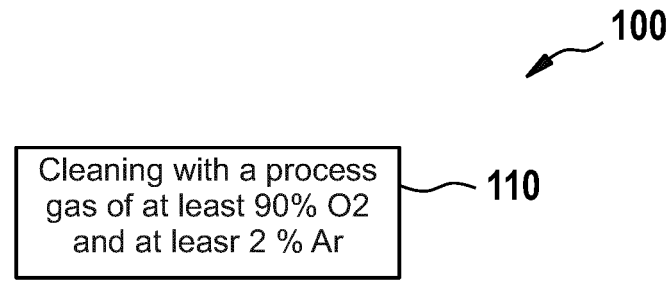
FIGS. 1A and 1B show flowcharts of methods for cleaning a vacuum system used in the manufacture of OLED devices according to embodiments described herein.

Reference will now be made in detail to the various embodiments of the disclosure, one or more examples of which are illustrated in the figures. Within the following description of the drawings, the same reference numbers refer to same components. Generally, only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

The vacuum conditions and the amount of contamination, particularly organic contamination, inside a vacuum chamber can strongly influence the quality of material layers deposited on a substrate. In particular, for OLED mass production, a cleanliness of vacuum components strongly effects the life time of a manufactured device. Even electropolished surfaces may still be too dirty for OLED device fabrication. Some embodiments of the present disclosure use plasma cleaning, e.g. with a remote plasma source, for vacuum cleaning. For example, the vacuum cleaning can be provided after a pre-cleaning procedure e.g. as a final cleaning procedure for a vacuum system. Embodiments of the present disclosure, relate to ultra clean vacuum (UCV) cleaning.

For example, a plasma cleaning can be used to treat a vacuum chamber and/or parts or components of the vacuum system. For example, the plasma cleaning can be performed under vacuum before a process startup or starting production to improve cleanliness levels. The treatment can be performed for a certain time with a remote plasma of e.g. pure oxygen or oxygen mixtures with nitrogen or argon. According to some embodiments remote plasma source (RPS) can be utilized to create active species from a process gas. The chemically active species react with organic molecules, such as carbon-based components. Upon reaction with the organic molecules, the molecules are dissociated into smaller fragments. The desorption enthalpy of the smaller fragments is lower as compared to the intact organic molecules. The lower enthalpy enables a faster pump out of the fragments. Accordingly a better cleaning efficiency can be provided.

Active species may be generated from pure oxygen, clean dry air (CDA) process gas, and/or argon mixture process gases. Embodiments of the present disclosure provide an improved activation probability of oxygen. Accordingly, the concentration of active species provided by a remote plasma source can be increased. As described herein, according to embodiments of the present disclosure, the activation probability can be increased by having an oxygen concentration of 90% or above and an argon concentration of 2% or above. For example, oxygen concentration of a process gas can be about 95% and an argon concentration of the process gas can be about 5%. Increasing the activation probability of oxygen may theoretically result in an increase of the cleaning efficiency of about 30%. For a cleaning process with an initial cleaning efficiency resulting in a first cleaning time period, the first cleaning time period can be reduced by 30% due to an improved process gas composition according to embodiments of the present disclosure. The plasma chemistry can improve the overall active species concentration, which is responsible for the cleaning effect.

According to embodiments of the present disclosure, the amount of chemicals, elements, or compounds are provided in % refers to Vol.-%.

According to embodiments of the present disclosure, a cleaning process utilizes an improved chemistry of an in-situ cleaning device and/or a process gas in a remote plasma source. Accordingly, an existing cleaning efficiency may be further improved. For example, a clean process to be further improved may be a plasma cleaning process, which utilizes very low vacuum levels. The very low vacuum levels can significantly increase the cleaning efficiency, particularly for large volume vacuum chambers. Contrary to the industry-standard to use higher vacuum levels to generate a higher active species concentration, inventors of the present invention have found that, as described in more detail below, very low vacuum levels can be utilized as described herein to increase the cleaning efficiency.

According to some embodiments of the present disclosure, a method for cleaning a vacuum chamber, particularly a vacuum chamber used in the manufacture of OLED devices, is provided. The method includes cleaning at least one of an inside of the vacuum chamber and a component inside the vacuum chamber with active species. The process gas for generating the active species includes at least 90% oxygen and at least 2% argon, particularly, wherein the process gas includes about 95% oxygen and about 5% argon.

Figure 6:
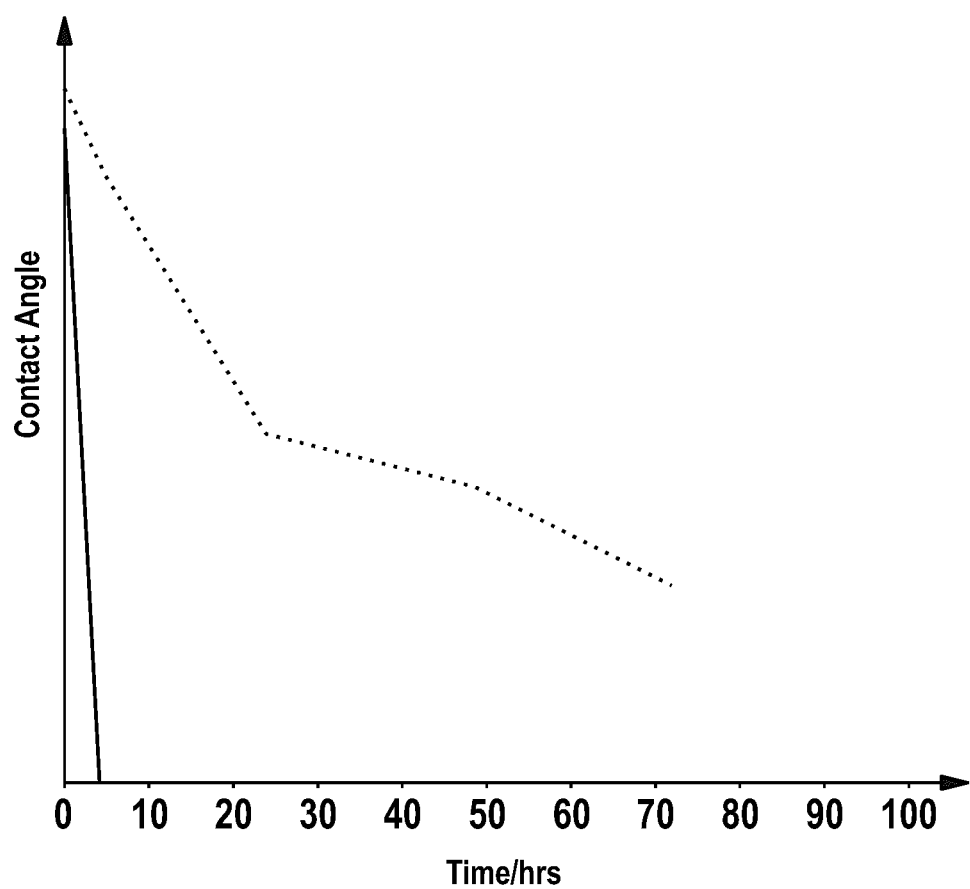
FIG. 6 shows a graph comparing the cleaning efficiency of a standard cleaning process and the cleaning efficiency of a process according to embodiments of the present disclosure.

Optionally, the cleaning procedure may be conducted at a pressure of $5*10^{-3}$ mbar or below, particularly $1*10^{-4}$ mbar or below. The cleanliness of the chamber or surface can for example be determined by a contact angle measurement. As exemplarily shown in FIG. 6, the dotted curve shows the cleaning efficiency of a standard cleaning process. The contact angle can, for example, be reduced slightly below 10 within slightly over 70 hours. The solid line shows the cleaning process according to embodiments of the present invention. A contact angle of almost zero measured, for example, by vacuum exposure of (110) silicon substrate, can be reached in a very short time, for example, within 10 hours or below or even 5 hours or below. The contact angle may be measured on a pre-cleaned, (110) silicon substrate with 16 hours of vacuum exposure in the cleaned chamber. The cleaning efficiency can be increased by at least one order of magnitude or even some orders of magnitude. Compared to conventional cleaning strategies used in OLED industry, for example, "bake-out under vacuum", embodiments of the present disclosure are not based on elevated temperatures to reduce and/or remove organic contamination inside the vacuum chamber. Especially when having temperature sensitive components, for example electronics, inside the system, bake-out is not a beneficial option. Furthermore, usage of active species according to embodiments of the present disclosure show a higher cleaning efficiency compared to the conventional strategy, and particularly also without a bake-out procedure.

According to embodiments of the present disclosure, active species are emitted into or provided into a vacuum chamber, for example, to clean the surfaces in the chamber. An in-situ cleaning principal, for example, cleaning walls of the vacuum chamber and components within the vacuum chamber can be very efficient for cleaning microscopic layers, such as a few monolayers. According to embodiments of the present disclosure, which can be combined with other embodiments described herein, active species can be chemically active species, such as excited molecules or atoms, e.g. to dissociate contamination molecules.

The cleaning method according to embodiments of the present disclosure includes creation of excited states of molecules, for example, oxygen. Accordingly, reactive O, O3 and/or other active species may be provided, wherein an improved activation probability of oxygen can be achieved. For example, the active species can be created with a plasma, particularly in a remote plasma source.

For embodiments including cleaning at a reduced pressure, the following aspects can be beneficially considered. At each collision a plasma molecule (e.g. O) may decay into a stable state of $O_2$. $O_2$ is non-reactive. Lower pressure results in lower densities and, thus, in a reduced initial active species concentration. However, lower pressure increases the mean free path length of the excited molecules.

For example, the mean free path length can be calculated as:

$$\lambda = \frac{k_B T}{\sqrt{2}\,\pi d^2 P\,\text{(Pascal)}}$$

Resulting values can be, for example, about 6 m at $10^{-3}$ Pa and correspondingly 6 mm at 1 Pa.

As described above, the lifetime of the chemically active species is limited. With each collision, for example, with other molecules in the vacuum, with chamber walls, or with surfaces of components, there is a probability for the active species to recombine to non-reactive molecules. At high pressures, e.g. 1 mbar or more, the amount of atoms per volume is high. Further, the mean free path length, i.e. the average distance between collisions, is small. The probability of reaching a far-away surface of a large chamber is therefore small, even if the initial concentration of created active species is high.

Some embodiments of the present disclosure as described herein, may utilize low pressure, which results in longer mean free path lengths of the active species. The mean free path length can be tuned by changing the chamber pressure. The scattering characteristic changes continuously from atom-to-atom (or molecule-to-molecule) collision to atom-to-wall collision (i.e., line-of-sight scattering) when the chamber pressure is reduced.

For OLED chambers an average wall-to-wall distance of 3 m may be provided. The mean free path length of active species therefore may thus be less than 3 m to ensure homogeneous distribution through scattering. Further, the mean free path length may be 0.5 m or more to have a good reach in the chamber. For example, a base pressure of, for example, $5*10^{-5}$ mbar or above and/or of $9*10^{-5}$ mbar or below can be provided according to some embodiments, which can be combined with other embodiments described herein. An average wall-to-wall distance or an average distance of the walls may, for example, be defined as follows. A vacuum chamber typically has a bottom wall and top wall having a vertical distance. Further, the vacuum chamber typically has two opposing side walls having a first horizontal distance and further two opposing side walls having a second horizontal distance. For example, an average distance of walls can be the average from the vertical distance, the first horizontal distance and the second horizontal distance. The above exemplarily refers to a cuboid shape vacuum chamber. For a cylindrical chamber or a chamber having a trapezoidal cross-section, the average distance can be calculated in a similar manner.

According to some embodiments, which can be combined with other embodiments described herein, a method for cleaning a vacuum chamber, particularly a vacuum chamber used in the manufacture of OLED devices is provided. The method includes determining an average distance of the walls of the vacuum chamber and cleaning at least one of surfaces of the walls of the vacuum chamber and a component inside the vacuum chamber with active species at a pressure corresponding to a mean free path length of 20% to 97% of the average distance of the walls.

FIG. 1A shows a flowchart of a method 100 for cleaning a vacuum system used, for example, in the manufacture of OLED devices according to embodiments described herein.

The method 100 includes cleaning with active species, wherein a process gas for generating the active species includes at least 90% oxygen and at least 2% argon, particularly, wherein the process gas includes about 95% oxygen and about 5% argon. (block 110). For example, the active species can be generated with a plasma source, for example, remote plasma source, and/or UV light. A plasma cleaning can be a final cleaning procedure before operating the vacuum system e.g. to deposit layers of one or more organic materials on a substrate or can be a cleaning procedure during operation, e.g. in idle times. The term "final" is to be understood in the sense that no further cleaning procedures are performed after the plasma cleaning.

In a remote plasma source, a gas, for example, the process gas, is typically activated in a remote chamber distant from a vacuum chamber, in which the cleaning treatment is to be performed. Such an activation may be carried out e.g. in the remote plasma source. Examples of remote plasmas used in the embodiments of the present disclosure include, but are not limited to, remote plasmas of oxygen mixtures with argon.

A pre-cleaning for cleaning at least the portion of the vacuum system and the plasma cleaning using e.g. a remote plasma source for cleaning at least the portion of the vacuum system can be used for various components of the vacuum system. In some implementations, the pre-cleaning and the plasma cleaning respectively include a cleaning of the vacuum chamber. For example, cleaning respectively includes a cleaning of one or more inner walls of the vacuum chamber. Additionally or alternatively, the cleaning can include a cleaning of one or more components inside the vacuum chamber of the vacuum system. The one or more components can be selected from the group consisting of mechanical components, movable components, drives, valves, and any combination thereof. For example, the mechanical components can be any components provided inside the vacuum chamber, such as movable components used for operating the vacuum system. An exemplary movable component includes, but is not limited to, a valve, such as a gate valve. The drives can include drives used for transportation of substrates and/or carriers in the vacuum system, drives or actuators for substrate and/or mask alignment, drives for valves, such as gate valves, separating adjacent vacuum regions or chambers, and the like.

According to some embodiments, which can be combined with other embodiments described herein, a method for cleaning, for example, the method 100, is performed after a maintenance procedure of the vacuum system or portions of the vacuum system. In particular, a pre-cleaning, such as a wet cleaning, after maintenance may not be sufficient to achieve proper cleanliness levels for OLED mass production. The cleaning procedure, i.e., the plasma cleaning, after a pre-cleaning, can ensure cleanliness levels that can improve a quality of the layers of the organic materials deposited during a deposition process, such as a thermal evaporation process. Plasma cleaning can also be used to prevent recontamination caused by outgassing of polymers (o-rings, cables, etc) during production or system idle time The term "maintenance procedure" can be understood in the sense that the vacuum system is not operated to be able to perform various tasks, such as servicing and/or initial installation of the vacuum system or portions of the vacuum system. The maintenance procedure can be performed cyclically, e.g., in predetermined servicing intervals.

In some implementations, the cleaning is performed in one or more (vacuum) chambers of the vacuum system selected from the group consisting of a load lock chamber, a cleaning chamber, a vacuum deposition chamber, a vacuum processing chamber, a transfer chamber, a routing module, and any combination thereof.

As described above, some embodiments of the present disclosure may refer to the cleaning process at low pressure, particularly a low pressure that may be adapted to the size, and optionally the geometry, of the vacuum chamber to be cleaned. Display manufacturing, such as manufacturing of OLED displays is conducted on large area substrates. For example, the size of the substrate can be 0.67 m² or above, such as 1 m² or above.

The systems described herein can be utilized for evaporation on large area substrates, e.g., for OLED display manufacturing. Specifically, the substrates for which the systems according to embodiments described herein are provided, are large area substrates. For instance, a large area substrate or carrier can be GEN 4.5, which corresponds to a surface area of about 0.67 m² (0.73×0.92 m), GEN 5, which corresponds to a surface area of about 1.4 m² (1.1 m×1.3 m), GEN 6, which corresponds to a surface area of about 2.7 m² (1.5 m×1.8 m), GEN 7.5, which corresponds to a surface area of about 4.29 m² (1.95 m×2.2 m), GEN 8.5, which corresponds to a surface area of about 5.7 m² (2.2 m×2.5 m), or even GEN 10, which corresponds to a surface area of about 8.7 m² (2.85 m×3.05 m). Even larger generations such as GEN 11 and GEN 12 and corresponding surface areas can similarly be implemented. Half sizes of the GEN generations may also be provided in OLED display manufacturing.

According to embodiments of the present disclosure, an improved pressure level for cleaning with active species can be provided depending on the size of the chamber. Accordingly, lower pressures may beneficially be utilized for larger chambers. For smaller chambers, the pressure may be higher, corresponding to the shorter mean free path length.

According to yet further embodiments, which can be combined with other embodiments described herein, the findings of the inventors relating to low pressure cleaning may similarly be applicable to vacuum chambers in the semiconductor industry, for example, wafer processing or wafer inspection. As the chambers may typically be smaller, the pressures may be higher. Particularly embodiments, which refer to optimizing the mean free path length according to an average chamber wall distance, are applicable for the smaller vacuum chambers. Further, additionally or alternatively, improvement or optimization of further cleaning parameters may similarly be applied to semiconductor manufacturing.

Figure 1B:
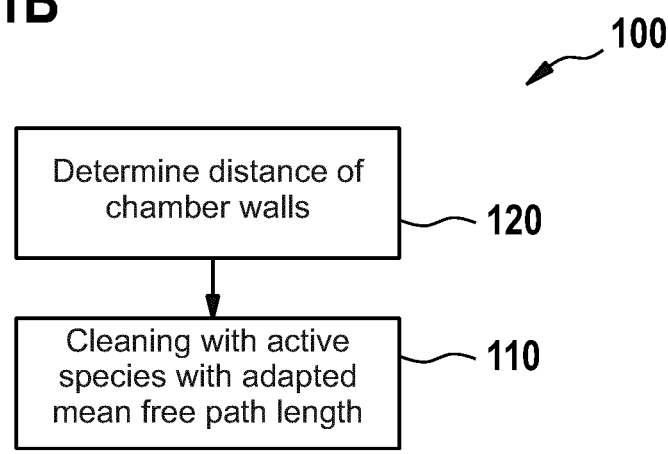

FIG. 1B shows a flowchart of a method 100 for cleaning a vacuum system used, for example, in the manufacture of OLED devices according to embodiments described herein.

The method 100 includes determining an average distance of the walls of the vacuum chamber as described above (block 120), and performing cleaning with active species at low pressures (block 110). The low pressure corresponds to a mean free path length of 20% to 97% of the average distance of the walls Yet further embodiments, which may optionally be combined with other embodiments described herein, refer to adapted process parameters used for cleaning chemistry as described herein.

Particularly for the manufacturing of OLED devices, the quality of the vacuum in the vacuum chamber and contamination within the vacuum chamber strongly influences the device performance. Particularly the lifetime of the manufacture devices may be dramatically reduced by contamination. Accordingly, the surfaces inside the vacuum chambers need frequent cleaning. Processing chambers, manufacturing chambers, transfer chambers, transport chambers, storage chambers, and assembly chambers are sensitive to contamination. Human interaction with the inner surfaces of such chambers introduces organic and non-organic contamination that is absorbed by the surfaces of the chambers and/or the surfaces of the components.

Even though wet cleaning processes of inner surfaces by human operators may be time-consuming and labor-intensive, wet cleaning is beneficial to remove microscopic contamination like solvent received use, particles, and the like. Further, human operators may introduce additional organic contamination into the system and some services may not be reached efficiently by a human operator.

According to embodiments of the present disclosure, a wet cleaning process may be introduced to remove microscopic contamination. An in situ cleaning process may be provided after the wet cleaning process or another precleaning process according to embodiments described herein.

As described above, the reduced pressure determining the mean free path length of the active species is one parameter to improve the cleaning efficiency. The pressure determines the concentration of active species, which reach the contaminated surfaces, for example, the concentration of active species responsible for the cleaning efficiency. The active species may be a fraction of the total process gas in the vacuum chamber. By setting the chamber pressure and, accordingly the mean free path length, the number of active species reaching contaminated surfaces is defined, given the constant pumping speed. By increasing the pumping speed, the operating pressure (and the mean free pass) can be maintained when increasing the inlet flow.

According to some embodiments, which can be combined with other embodiments described herein, the inlet flow may be increased without reducing activation efficiency of the plasma.

Figure 2:
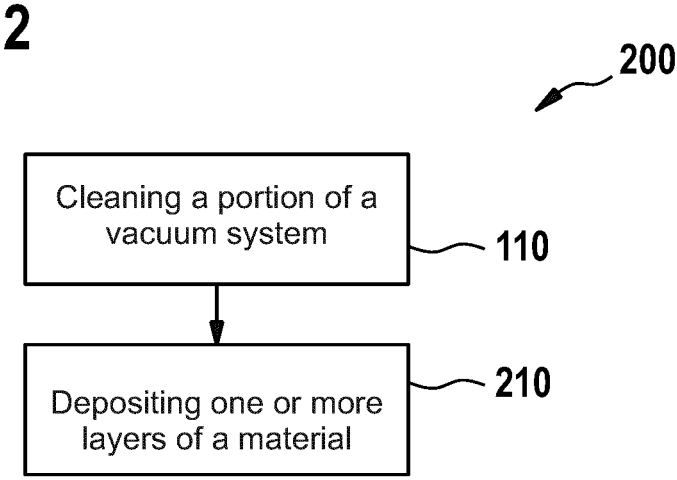
FIG. 2 shows a flowchart of a method for vacuum processing of a substrate to manufacture OLED devices according to embodiments described herein.

FIG. 2 shows a flowchart of a method 200 for vacuum deposition on a substrate to manufacture OLED devices, display devices or semiconductor devices. The method may be particularly useful for OLED devices in light of the sensitivity to organic contaminations. The method 200 can include the aspects of the method for cleaning a vacuum system used in the manufacture of e.g. OLED devices according to the present disclosure.

The method 200 includes performing cleaning at least a portion of the vacuum system (block 110), and depositing one or more layers of a material, such as an organic material, on the substrate (block 210).

The plasma cleaning according to some embodiments of the present disclosure can significantly improve a cleanliness level of the vacuum system and/or the cleaning efficiency. The plasma cleaning may result at a contact angle of almost zero within 5 hours or less of cleaning for a vacuum chamber for a large area substrate. The contact angle may be measured on a pre-cleaned, (110) silicon substrate with 16 hours of vacuum exposure in the cleaned chamber.

Figure 3:
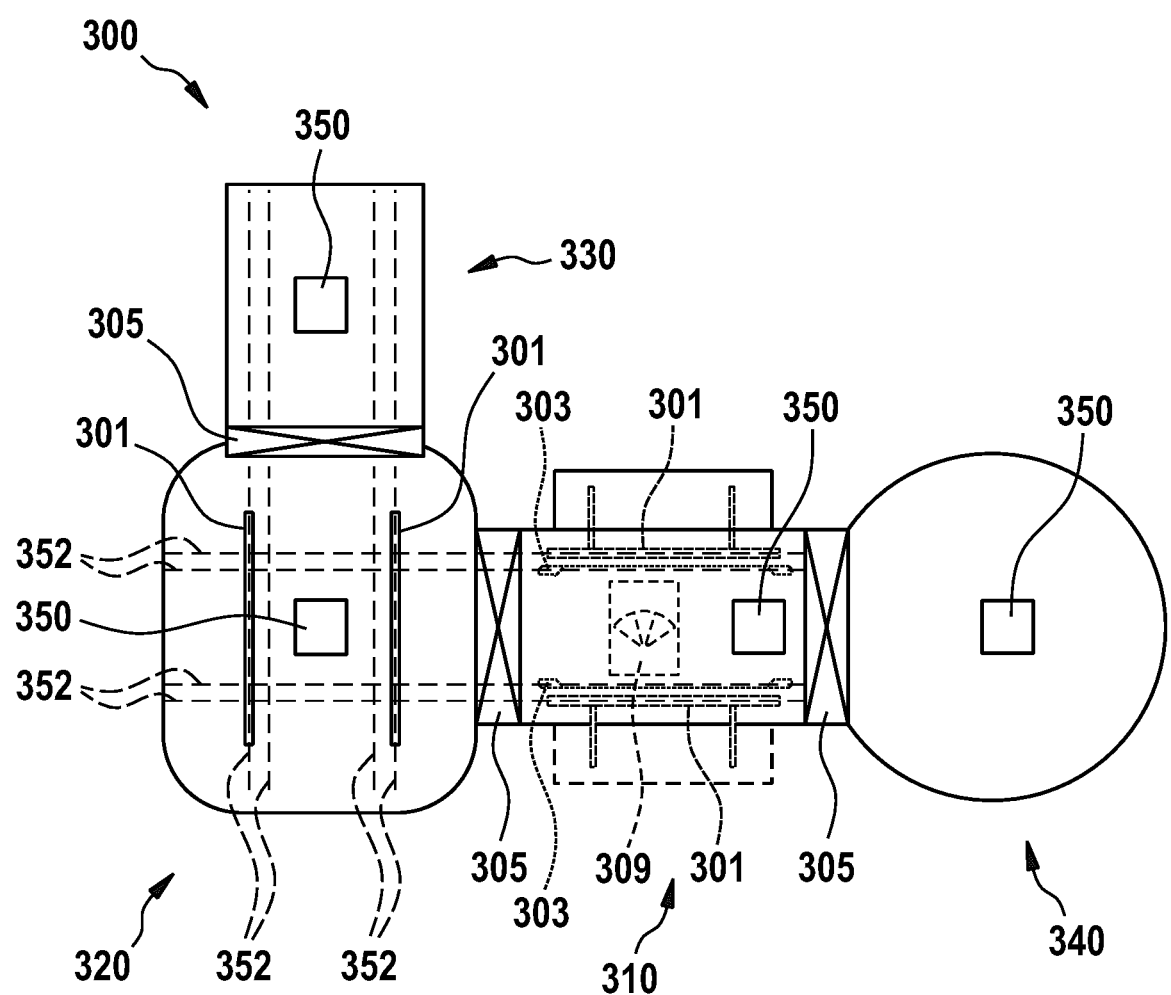
FIG. 3 shows a schematic view of a system for vacuum processing a substrate to manufacture OLED devices according to embodiments described herein.

FIG. 3 shows a portion of a processing system 300 for e.g. vacuum deposition on a substrate to manufacture OLED devices according to embodiments described herein.

In FIG. 3 a process modules 310 is connected to a routing module 320. A maintenance module 340 may be coupled to the process module. A transit module 330 provides a path along a transportation direction from the first routing module to a second routing module (not shown). Each of the modules may have one or more vacuum chambers. Further, the transit module may provide two or more tracks, e.g. four transportation tracks 352, wherein a carrier can be moved out of one of the routing modules. As shown in FIG. 3, a transportation direction along the routing module and/or the transit module may be a first direction. Further routing modules may be connected to a further process modules (not shown). As shown in FIG. 3, gate valves 305 can be provided between neighboring modules or vacuum chambers, respectively, along the first direction, for example, between the transit module and an adjacent routing module and along a second direction. The gate valves 305 can be closed or opened to provide a vacuum seal between the vacuum chambers. The existence of a gate valve may depend on the application of the processing system, e.g. on the kind, number, and/or sequence of layers of organic material deposited on a substrate. Accordingly, one or more gate valves can be provided between transfer chambers.

According to typical embodiments, the first transportation track 352 and the second transportation track 352 are configured for contactless transportation of the substrate carrier and/or the mask carrier to reduce contamination in the vacuum chambers. In particular, the first transportation track and the second transportation track may include a holding assembly and a drive structure configured for a contactless translation of the substrate carrier and/or the mask carrier.

As illustrated in FIG. 3, in the first routing module 320, two substrates 301 are rotated. The two transportation tracks, on which the substrates are located, are rotated to be aligned in the first direction. Accordingly, two substrates on the transportation tracks are provided in a position to be transferred to the transit module and the adjacent further routing module.

According to some embodiments, which can be combined with other embodiments described herein, the transportation tracks of the transportation track arrangement may extend from the vacuum process chamber into a vacuum routing chamber 320, i.e. can be oriented in the second direction which is different from the first direction. Accordingly, one or more of the substrates can be transferred from a vacuum process chamber to an adjacent vacuum routing chamber. Further, as exemplarily shown in FIG. 3, a gate valve 305 may be provided between a process module and a routing module which can be opened for transportation of the one or more substrates. Accordingly, it is to be understood that a substrate can be transferred from the first process module to the first routing module, from the first routing module to the further routing module, and from the further routing module to a further process module. Accordingly, several processes, e.g. depositions of various layers of organic material on a substrate can be conducted without exposing the substrate to an undesired environment, such as an atmospheric environment or non-vacuum environment.

FIG. 3 further illustrates masks 303 and substrates 301 in the process module 310. A deposition source 309 can be provided between the masks and/or substrates, respectively.

Each vacuum chamber of the modules shown in FIG. 3 includes a remote plasma source 350. For example, a remote plasma source may be mounted to a chamber wall of the vacuum chamber. Exemplarily, the chamber wall may be an upper chamber wall. Even though the processing system 300 shows vacuum chambers with remote plasma sources at each chamber, a processing system may include at least one remote plasma source 350. Particularly, a processing system 300 may include a first vacuum chamber with the first remote plasma source 350 and a second vacuum chamber with a second remote plasma source 350.

The remote plasma source 350, e.g. of the process module 310, is connected to the vacuum chamber. A controller connected to the remote plasma source is configured to perform plasma cleaning according to embodiments of the present disclosure. In particular, the controller can be configured to implement the method for cleaning a vacuum system or vacuum chamber used, for example in the manufacture of OLED devices, of the present disclosure. An exemplary vacuum chamber with a remote plasma source is described in more detail with respect to FIG. 4.

One or more vacuum pumps, such as turbo pumps and/or cryo-pumps, can be connected to the vacuum chamber e.g. via one or more tubes such as bellow tubes for the generation of a technical vacuum inside the vacuum chamber. A controller can further be configured to control the one or more vacuum pumps to reduce the pressure in the vacuum chamber e.g., prior to the plasma cleaning procedure.

The term "vacuum" as used throughout the present disclosure can be understood in the sense of a technical vacuum having a vacuum pressure of less than, for example, 10 mbar. The pressure in the vacuum chamber may be between $10^{-3}$ mbar and about $10^{-7}$ mbar, specifically between $10^{-4}$ mbar and $10^{-5}$ mbar, particularly for vacuum chambers for processing large area substrates.

As shown in FIG. 3, a vacuum processing system 300 may have a plurality of different modules. Each module may have at least one vacuum chamber. The vacuum chambers may differ in size and geometry. As described above, according to some embodiments of the present disclosure, which can be combined with other embodiments described herein, the cleaning efficiency of a cleaning with active species can be strongly increased by adapting the mean free path length to the size and the geometry of the vacuum chamber. A good compromise between atom-to-atom collisions to increase the homogeneity of distribution of active species in the vacuum chamber and atom-to-wall collisions, i.e. having a sufficient reach of active species within the chamber, can be determined. Choosing a beneficial compromise between the different scattering mechanisms strongly increases the cleaning efficiency.

Accordingly, according to some embodiments, the pressure within a vacuum chamber during a cleaning with active species can be adapted individually for two or more vacuum chambers in the vacuum processing system. The mean free path length is improved or optimized for the individual chamber sizes and/or chamber geometries. According to one embodiment, a method for cleaning a vacuum system having a first vacuum chamber and a second vacuum chamber is provided. The method includes cleaning the first vacuum chamber with active species at a first pressure below 1 mbar, and cleaning the second vacuum chamber with active species at a second pressure below 1 mbar different to the first pressure.

According to embodiments of the present disclosure, cleaning with active species of, for example, a remote plasma source can be highly efficient. A typical remote plasma source has a pressure range for ignition of the source. For example, ignition of the remote plasma source is possible at a pressure of 0.05 mbar or above, such as 0.1 mbar to 1.5 mbar. The remote plasma source and, accordingly, the volume in which the active species are generated within the remote plasma source is connected to the vacuum chamber. Accordingly, the chamber pressure of a vacuum chamber may be raised to the ignition pressure of the remote plasma source, which is connected to the vacuum chamber after ignition, the cleaning conditions with reduced pressures are generated. Pumping of the vacuum chamber takes additional time and may limit the cleaning application to times directly after preventive maintenance. A cleaning procedure without increasing the chamber pressure of the vacuum chamber to be cleaned would allow for a more frequent cleaning. Embodiments described exemplarily with respect to FIG. 4 below allow for a cleaning process with high-efficiency also during short interruptions or idle times. Accordingly, control of a recontamination and overall contamination level can be provided during production. Consistent high quality of OLED devices can be ensured. Accordingly, embodiments described herein also allow for efficient cleaning of the contamination, since idle times during short interruptions can be utilized for remote plasma cleaning.

Figure 4:
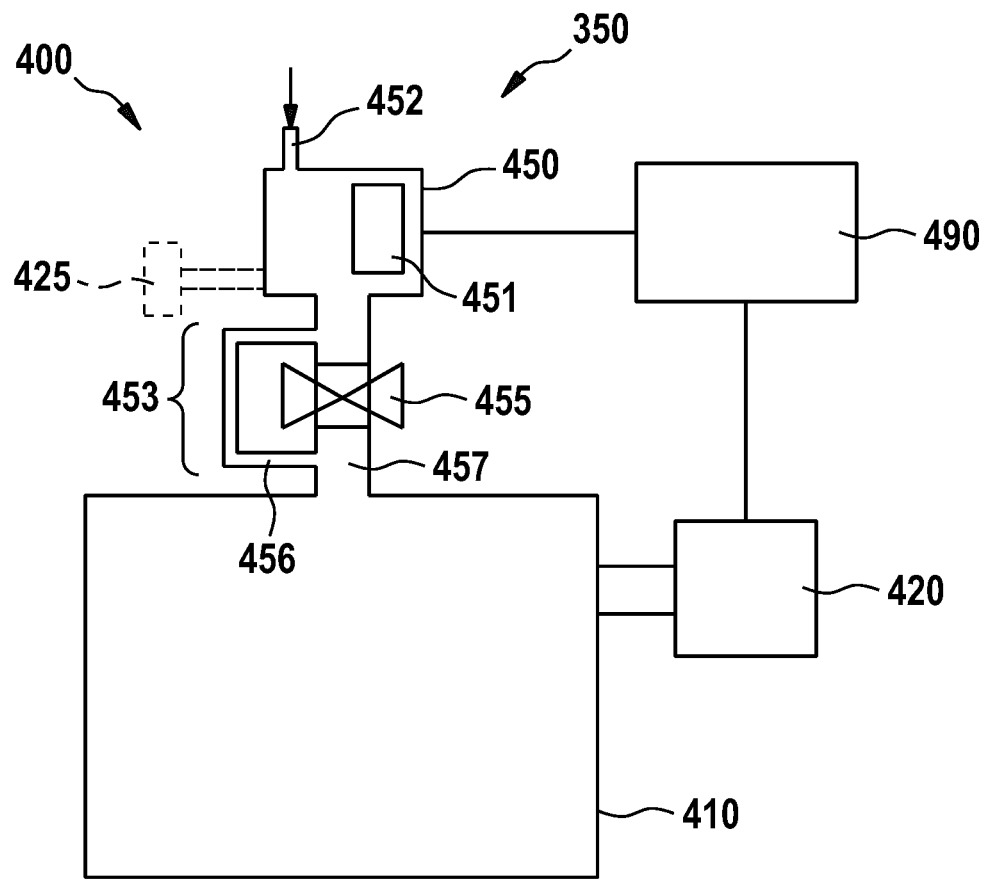
FIG. 4 shows a schematic view of an apparatus for cleaning a vacuum chamber according to embodiments described herein.

FIG. 4 shows an apparatus 400 for vacuum processing a substrate. For example, the substrate can be a large area substrate as described herein or a wafer for semiconductor industry. Particularly, the apparatus for vacuum processing can be configured for manufacturing of OLED devices or included in a processing system to manufacture OLED devices. The apparatus includes a vacuum chamber 410. The vacuum chamber 410 can be evacuated with a vacuum pump 420. Particularly for OLED processes, the vacuum pump can be a cryo pump. The remote plasma source 350 is coupled to the vacuum chamber 410. According to some embodiments, the remote plasma source can be coupled to an upper wall of the vacuum chamber.

The remote plasma source 350 includes an enclosure 450, in which the plasma is generated and a plasma generator 451. For generation of active species, a process gas inlet 452 is provided at the enclosure 450. During operation, a process gas such as oxygen containing process gas can be provided to the remote plasma source through the process gas inlet 452. For example, the process gas may include oxygen and at least one of nitrogen and argon. The valve 455 can be provided between the remote plasma source 350 and the vacuum chamber 410. For example, the valve 455 can be included in a flange 453 connecting the remote plasma source 350 with the vacuum chamber 410.

The valve 455 allows having different pressures in the vacuum chamber 410 and the enclosure 450 of the remote plasma source 350. Accordingly, the remote plasma source 350 can be ignited at a comparably high pressure while the vacuum chamber 410 is maintained at a comparably low pressure. According to some embodiments, which can be combined with other embodiments described herein, a bypass for the valve 455 is provided. The bypass 456 allows fluid communication between the enclosure 450 and the vacuum chamber 410. If the valve 455 is in a closed position, a process gas flow through the process gas inlet 452 would change the pressure in the enclosure 450 without having an outlet for the incoming process gas flow.

Accordingly, a process gas outlet in addition to the conduit 457 connecting the remote plasma source and the vacuum chamber is beneficially provided according to embodiments described herein. The process gas outlet can be a bypass 456. According to additional or alternative modifications, which can be combined with other embodiments described herein, a process gas outlet may also be a pump 425 connected to the remote plasma source. A process gas outlet in addition to the conduit 457 allows for generating stable ignition conditions for the remote plasma source. After ignition of the remote plasma source, the valve 455 in the conduit 457 can be opened. Active species can be provided from the enclosure of the remote plasma source to the vacuum chamber 410. The conduit 457 may be a further portion of the flange 453.

Some embodiments of the present disclosure use a bypass to create ignition conditions in the remote plasma source, while the chamber pressure is almost unaffected. After opening a valve corresponding, e.g. associated with the bypass, improved cleaning conditions according to embodiments of the present disclosure can be reached almost instantly.

The remote plasma source (RPS) is connected to the vacuum chamber using a flange. Incorporated in the flange can be a valve, such as a pendulum valve, that can isolate the vacuum chamber and the remote plasma source unit. According to some embodiments, which can be combined with other embodiments described herein, a small tube with, for example, a variable orifice, is attached to the top of the flange (the RPS side) and the bottom of the flange (the chamber side). The small tube bypasses the valve.

For ignition of the plasma inside the RPS unit the valve is closed and an inlet flow streams into the RPS unit. The small bypass ensures constant pressure inside the plasma unit for ignition. After the plasma stabilizes, the valve can be opened. Active species created by the plasma inside the remote plasma source can move directly into the chamber for cleaning.

In light of the above, according to one embodiment, an apparatus for vacuum processing of a substrate, particularly to manufacture OLED devices is provided. The apparatus includes a vacuum chamber, and a remote plasma source connected to the vacuum chamber. The remote plasma source has a process gas inlet, a conduit for active species, and a process gas outlet. For example, the conduit can connect the vacuum chamber and an enclosure of the remote plasma source. The process gas outlet and the conduit may be included in a flange of the remote plasma source. The apparatus further includes a valve between the vacuum chamber and the remote plasma source positioned to open or close the conduit. According to some embodiments, the apparatus may further include a bypass for the conduit connecting the process gas outlet and the vacuum chamber.

FIG. 4 shows a controller 490. The controller 490 is connected to the vacuum pump 420 and the remote plasma source 350. The controller 490 may include a central processing unit (CPU), a memory and, for example, support circuits. To facilitate control of the apparatus for processing a substrate, the CPU may be one of any form of general purpose computer processor that can be used in an industrial setting for controlling various chambers and sub-processors. The memory is coupled to the CPU. The memory, or a computer readable medium, may be one or more readily available memory devices such as random access memory, read only memory, floppy disk, hard disk, or any other form of digital storage either local or remote. The support circuits may be coupled to the CPU for supporting the processor in a conventional manner. These circuits include cache, power supplies, clock circuits, input/output circuitry and related subsystems, and the like. Inspecting process instructions and/or instructions for generating a notch in an electronic device provided on the substrate are generally stored in the memory as a software routine typically known as a recipe. The software routine may also be stored and/or executed by a second CPU (not shown) that is remotely located from the hardware being controlled by the CPU. The software routine, when executed by CPU, transforms the general purpose computer into a specific purpose computer (controller) that controls the apparatus operation such as controlling inter alia the vacuum pump 420 and the remote plasma source 350. Although the method and/or process of the present disclosure is discussed as being implemented as a software routine, some of the method steps that are disclosed therein may be performed in hardware as well as by the software controller. As such, the embodiments may be implemented in software as executed upon a computer system, and hardware as an application specific integrated circuit or other type of hardware implementation, or a combination of software and hardware. The controller may execute or perform a method for cleaning the vacuum chamber and/or processing a substrate, for example, for display manufacturing according to embodiments of the present disclosure.

According to embodiments described herein, the method for vacuum processing of a substrate can be conducted using computer programs, software, computer software products and the interrelated controllers, which can have a CPU, a memory, a user interface, and input and output devices being in communication with the corresponding components of the apparatus.

Figure 5:
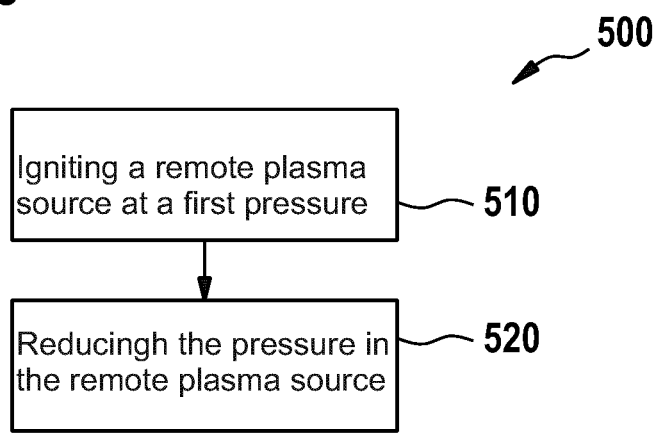
FIG. 5 shows a flowchart of a method for cleaning a vacuum system used in the manufacture of OLED devices according to embodiments described herein.

FIG. 5 shows a flow chart illustrating further methods 500 according to embodiments described herein. The method 500 is for cleaning a vacuum chamber, particularly a vacuum chamber used in the manufacture of an OLED device. The method includes (see block 510) igniting a remote plasma source at a first pressure within the remote plasma source while the vacuum chamber has a second pressure lower than the first pressure. The method further includes reducing the pressure in the remote plasma source to a pressure equal to or higher than the second pressure (see block 520). For example, some methods, which may be combined with other methods described herein, may include igniting the remote plasma source at a first pressure and reducing the pressure in the remote plasma source to a second pressure at least one order of magnitude smaller than the first pressure, particularly at least three orders of magnitude lower than the first pressure.

While the foregoing is directed to embodiments of the disclosure, other and further embodiments of the disclosure may be devised without departing from the basic scope thereof, and the scope thereof is determined by the claims that follow.

The invention claimed is:

1. A method for cleaning a vacuum chamber, comprising:
 cleaning at least one of a surface of a vacuum chamber and a component inside the vacuum chamber with an active species,
 wherein the cleaning comprises:
 igniting a remote plasma source at a first pressure;
 determining an average distance of walls of the vacuum chamber;
 reducing the first pressure in the remote plasma source to a second pressure at least three orders of magnitude smaller than the first pressure, the second pressure corresponding to an active species mean free path length of 20% to 97% of the determined average distance of the walls of the vacuum chamber; and
 introducing the active species from the remote plasma source to the vacuum chamber at the second pressure;
 wherein a process gas for generating the active species includes at least 90% oxygen and at least 2% argon.

2. The method of claim 1, wherein the cleaning is conducted at a chamber pressure of $5*10^{-3}$ or below.

3. The method of claim 2, wherein the second pressure is $1*10^{-4}$ mbar or below.

4. The method of claim 1, wherein:
 reducing the first pressure in the remote plasma source to the second pressure at least three orders of magnitude smaller than the first pressure occurs during the cleaning or before the cleaning.

5. The method of claim 4, wherein the cleaning includes cleaning of one or more inner walls of the vacuum chamber.

6. The method of claim 1, wherein the method is performed after a maintenance procedure of a vacuum system or portions of the vacuum system.

7. The method of claim 1, wherein the vacuum chamber is used to manufacture of OLED devices.

8. The method of claim 1, wherein the process gas includes about 95% oxygen and about 5% argon.

9. The method of claim 1, wherein the cleaning is conducted at a chamber pressure of $1*10^{-4}$ mbar or below.

10. A method for vacuum processing a substrate to manufacture OLED devices, comprising:
 cleaning at least one of a surface of a vacuum chamber and a component inside the vacuum chamber with an active species, wherein the cleaning comprises:
 igniting a remote plasma source at a first pressure,
 determining an average distance of walls of the vacuum chamber,
 reducing the first pressure in the remote plasma source to a second pressure at least three orders of magnitude smaller than the first pressure, the second pressure corresponding to an active species mean free path length of 20% to 97% of the determined average distance of the walls of the vacuum chamber,
 introducing the active species from the remote plasma source to the vacuum chamber at the second pressure, and
 depositing one or more layers of an organic material on the substrate,
 wherein a process gas for generating the active species includes at least 90% oxygen and at least 2% argon.

11. An apparatus for vacuum processing a substrate, comprising:
 a vacuum chamber;
 a remote plasma source connected to the vacuum chamber, the remote plasma source has a process gas inlet and a conduit for an active species; and
 a controller comprising a processor and a memory storing instructions that, when executed by the processor, are configured to cause the apparatus to perform a method comprising:
 cleaning at least one of a surface of the vacuum chamber and a component inside the vacuum chamber with the active species,
 wherein the cleaning comprises:
 igniting the remote plasma source at a first pressure,
 determining an average distance of walls of the vacuum chamber;
 reducing the first pressure in the remote plasma source to a second pressure at least three orders of magnitude smaller than the first pressure, the second pressure corresponding to an active species mean free path length of 20% to 97% of the determined average distance of the walls of the vacuum chamber, and
 introducing the active species from the remote plasma source to the vacuum chamber at the second pressure, and
 wherein a process gas for generating the active species includes at least 90% oxygen and at least 2% argon.

12. The apparatus according to claim 11, wherein the remote plasma source further comprises a process gas outlet; and the apparatus further comprises:
 a valve between the vacuum chamber and the remote plasma source positioned to open or close the conduit.

13. The apparatus according to claim 12, further comprising:
 a bypass for the conduit connecting the process gas outlet and the vacuum chamber.

14. The apparatus according to claim 11, wherein the apparatus for vacuum processing a substrate is configured to manufacture OLED devices.

* * * * *